(12) United States Patent
Freeman et al.

(10) Patent No.: US 10,062,708 B2
(45) Date of Patent: *Aug. 28, 2018

(54) MEMORY BLOCKS AND RELATED DEVICES AND METHODS

(71) Applicant: Micron Technology, Inc., Boise, ID (US)

(72) Inventors: Eric H. Freeman, Kuna, ID (US); Justin B. Dorhout, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/666,064

(22) Filed: Aug. 1, 2017

(65) Prior Publication Data

US 2017/0358595 A1 Dec. 14, 2017

Related U.S. Application Data

(63) Continuation of application No. 14/942,573, filed on Nov. 16, 2015, now Pat. No. 9,728,548.

(51) Int. Cl.
*H01L 27/115* (2017.01)
*H01L 27/11582* (2017.01)
*H01L 27/11573* (2017.01)

(52) U.S. Cl.
CPC .. *H01L 27/11582* (2013.01); *H01L 27/11573* (2013.01)

(58) Field of Classification Search
CPC ......... H01L 27/11526; H01L 27/11551; H01L 27/11573; H01L 27/11578; H01L 27/11582
See application file for complete search history.

(56) References Cited

U.S. PATENT DOCUMENTS

| | | |
|---|---|---|
| 7,972,955 B2 | 7/2011 | Choi et al. |
| 8,383,512 B2 | 2/2013 | Chen et al. |
| 8,405,142 B2 | 3/2013 | Katsumata et al. |
| 8,497,533 B2 | 7/2013 | Hyun et al. |
| 8,507,341 B2 | 8/2013 | Tran et al. |
| 8,530,350 B2 | 9/2013 | Freeman et al. |
| 8,557,661 B2 | 10/2013 | Yu et al. |
| 8,609,536 B1 | 12/2013 | Ha et al. |
| 8,693,250 B2 | 4/2014 | Maejima |

(Continued)

*Primary Examiner* — Allison P Bernstein
(74) *Attorney, Agent, or Firm* — TraskBritt (57) ABSTRACT

Vertical memory blocks for semiconductor devices include a memory cell region including an array of memory cell pillars and at least one via region including a dielectric stack of alternating dielectric materials and at least one conductive via extending through the dielectric stack. Semiconductor devices including a vertical memory block include at least one vertical memory block, which includes slots extending between adjacent memory cells of a three-dimensional array. The slots are separated by a first distance in a first portion of the block, and by a second, greater distance in a second portion of the block. Methods of forming vertical memory blocks include forming slots separated by a first distance in a memory array region and by a second, greater distance in a via region. At least one conductive via is formed through a stack of alternating first and second dielectric materials in the via region.

20 Claims, 8 Drawing Sheets (56) References Cited

U.S. PATENT DOCUMENTS

| | | |
|---|---|---|
| 8,759,217 B1 | 6/2014 | Chen |
| 8,933,502 B2 * | 1/2015 | Higashitani ....... H01L 27/11519 |
| | | 257/326 |
| 9,082,772 B2 | 7/2015 | Ha et al. |
| 9,257,444 B2 | 2/2016 | Oh et al. |
| 9,449,966 B2 * | 9/2016 | Chen ................... H01L 27/0688 |
| 9,455,268 B2 | 9/2016 | Oh et al. |
| 2012/0068253 A1 | 3/2012 | Oota et al. |
| 2013/0020647 A1 | 1/2013 | Hwang et al. |
| 2014/0061747 A1 | 3/2014 | Tanzawa et al. |
| 2014/0241026 A1 | 8/2014 | Tanzawa |
| 2015/0001613 A1 | 1/2015 | Yip et al. |

* cited by examiner

MEMORY BLOCKS AND RELATED DEVICES AND METHODS

CROSS-REFERENCE TO RELATED APPLICATION

This application is a continuation of U.S. patent application Ser. No. 14/942,573, filed Nov. 16, 2015, now U.S. Pat. No. 9,728,548, issued Aug. 8, 2017, the disclosure of which is hereby incorporated herein in its entirety by this reference.

FIELD

Embodiments of the present disclosure relate to semiconductor devices including vertical memory block constructions that include slots for forming conductive elements within the vertical memory block. Embodiments of the present disclosure also relate to vertical memory blocks that include conductive through-array vias.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes semiconductor pillars extending through openings in tiers of conductive structures (e.g., word line plates, control gate plates, access lines, word lines) and dielectric materials at each junction of the semiconductor pillars and the conductive structures. Such a configuration permits a greater number of transistors to be located in a unit of die area by building the array upwards (e.g., vertically) on a die, as compared to structures with conventional planar (e.g., two-dimensional) arrangements of transistors.

Conventional vertical memory arrays include tiers of conductive structures (e.g., access lines, word lines) separated by dielectric materials. One such vertical memory array is a so-called "MONOS" type memory array, which stands for metal-oxide-nitride-oxide-semiconductor, referring to the materials forming each individual memory cell. Conventional MONOS type memory arrays may be formed by forming the semiconductor pillars through a stack of alternating first and second dielectric materials, forming slots through the stack adjacent to the semiconductor pillars, removing the second dielectric materials through the slots, and replacing the second dielectric materials with a conductive material to form word line plates. During such a process, all or substantially all of the second dielectric material is replaced by the conductive material, such that a body of the vertical memory array includes alternating layers of the first dielectric material and the conductive word line plates.

Some conventional vertical memory arrays include so-called "through-array vias," which are conductive vias that extend through the vertical memory array to a sub-array feature. Through-array vias potentially reduce an area that the vertical memory array and associated circuitry covers on a semiconductor device, compared to vias or other contacts that are formed outside of an area of the vertical memory array. However, the formation of the through-array vias requires additional processing acts and cost. For example, to conventionally form such through-array vias that are electrically isolated from the conductive word line materials, a portion of the alternating layers of the first dielectric material and the conductive word line material is removed and replaced with a dielectric material, through which the through-array vias are formed.

It would, therefore, be desirable to develop improved structures and methods of forming vertical memory arrays with through-array vias for semiconductor devices (e.g., vertical memory devices, such as NAND Flash memory devices) that reduce the number and complexity of additional processing acts practiced in conventional methods and structures.

BRIEF DESCRIPTION OF THE DRAWINGS

FIGS. 9A through 13 illustrate different views of a vertical memory block at progressive stages of forming the vertical memory block according to an embodiment of the present disclosure.

DETAILED DESCRIPTION

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques and materials employed in the industry, which are known to one of ordinary skill in the art.

The fabrication processes described herein do not describe a complete process flow for processing semiconductor structures. The remainder of the process flow is known to those of ordinary skill in the art. Accordingly, only the methods and memory device structures necessary to understand embodiments of the present disclosure are described herein.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, material, and electrical changes may be made without departing from the scope of the disclosure. The illustrations presented herein are not meant to be actual views of any particular system, device, structure, or process, but are idealized representations that are employed to describe the embodiments of the present disclosure. The drawings presented herein are not necessarily drawn to scale.

Similar structures or components in the various drawings may retain the same or similar numbering for the convenience of the reader; however, the similarity in numbering does not mean that the structures or components are necessarily identical in size, composition, configuration, or other property.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, any relational term, such as "first," "second," "over," "top," "bottom," "underlying," etc., is used for clarity and convenience in understanding the disclosure and accompanying drawings and does not connote or depend on any specific preference, orientation, or order, except where the context clearly indicates otherwise.

As used herein, the term "forming" means and includes any method of creating, building, or depositing a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Depending on the specific material to be formed, the technique for forming the material may be selected by a person of ordinary skill in the art.

Embodiments of the present disclosure include memory devices including a vertical memory block that has one or more conductive vias extending through alternating dielectric materials in a via region thereof. The vertical memory block may include a three-dimensional (3D) array of MONOS-type memory cells having conductive access lines (e.g., metal word lines) extending through the 3D array adjacent to slots formed vertically through the 3D array. The slots may be separated from one another by a first distance in a memory array region of the vertical memory block. The slots may be separated by a second, greater distance in a via region of the vertical memory block, in which the one or more conductive vias are located and vertically extend. The via region may be located laterally adjacent to a stair step structure of the vertical memory block, longitudinally adjacent to the stair step structure, or in the memory array region of the vertical memory block.

Figure 1:
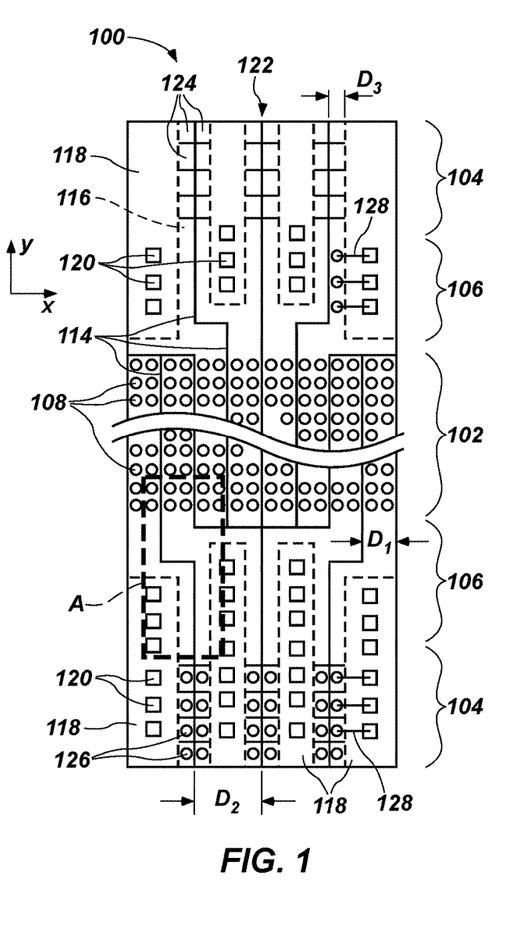
FIG. 1 shows a schematic top view of a vertical memory block including via regions laterally adjacent to conductive word lines according to an embodiment of the present disclosure.
Figure 2:
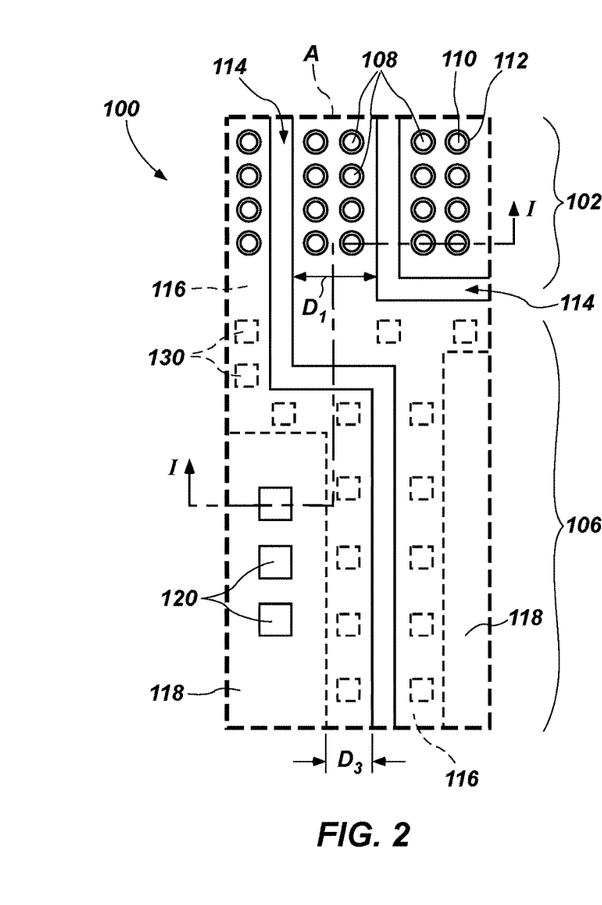
FIG. 2 shows a detailed top view of a portion of the vertical memory block of FIG. 1, taken from dashed box A of FIG. 1.
Figure 3:
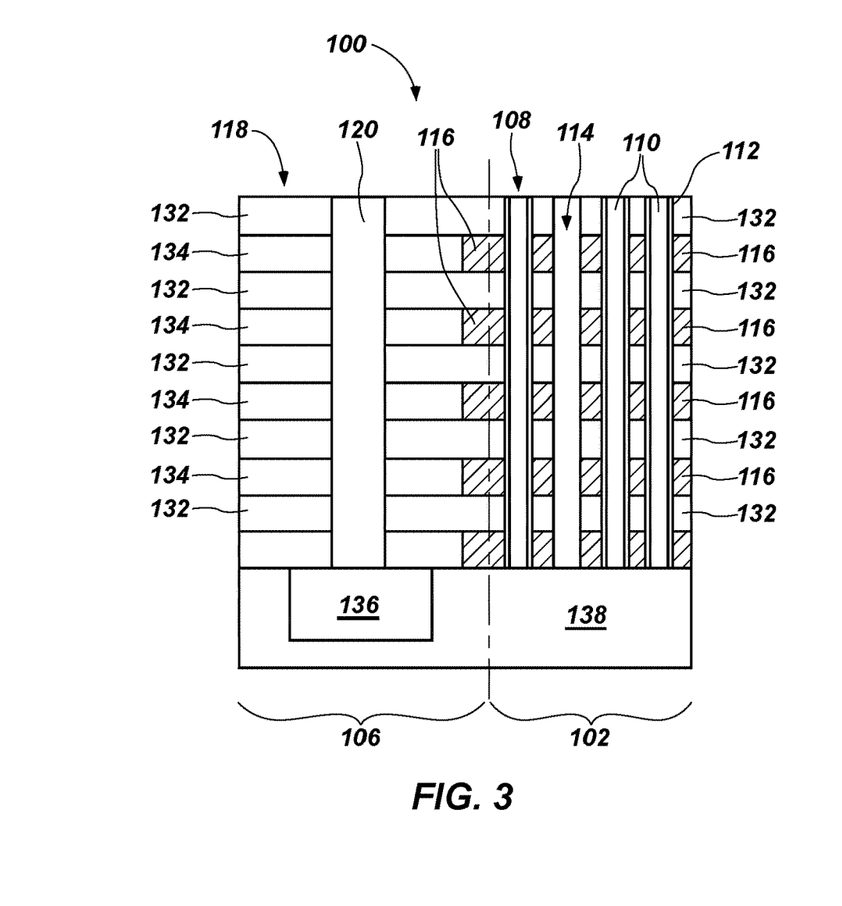
FIG. 3 shows a partial cross-sectional view taken of the vertical memory block of FIGS. 1 and 2, taken from section line I-I of FIG. 2.

FIG. 1 shows a top view of a vertical memory block 100 (also simply "memory block 100") of a memory device (e.g., a semiconductor memory device) according to an embodiment of the present disclosure. Portions of the vertical memory block 100 depicted in FIG. 1 do not show all features, so that underlying structures and elements can be seen more clearly. FIG. 2 shows a detailed top view of a portion of the vertical memory block 100 of FIG. 1, taken from dashed box A of FIG. 1. FIG. 3 shows a partial cross-sectional view taken of the vertical memory block 100 of FIGS. 1 and 2, taken from section line I-I of FIG. 2.

Referring to FIG. 1, the vertical memory block 100 may be elongated in a longitudinal direction y, may have a width in a lateral direction x, and may also have a height in a vertical direction in and out of the page from the perspective of FIG. 1. By way of example and not limitation, the width of the vertical memory block 100 in the lateral direction x may be between about 3 µm and about 5 µm. In some embodiments, the width of the vertical memory block 100 in the lateral direction x may be about 3.4 µm. A memory array region 102 may be generally centrally located in the vertical memory block in the longitudinal direction y. The vertical memory block 100 may include a stair step region 104 at one or both longitudinal ends of the vertical memory block 100. As shown in FIG. 1, a via region 106 may be located longitudinally between the array region 102 and each of the stair step regions 104.

FIG. 2 illustrates a detailed view, marked by dashed box A in FIG. 1, of a portion of the memory array region 102 and the via region 106 of the vertical memory block 100 of FIG. 1. Referring to FIGS. 1 and 2, in the memory array region 102, an array of memory cell pillars 108 may each extend vertically through the vertical memory block 100. Each of the memory cell pillars 108 may include a central region 110 of a semiconductor material, such as a polysilicon or silicon-germanium material, at least partially surrounded by a charge trapping material 112, such as an oxide-nitride-oxide ("ONO") material. Slots 114 (shown in FIG. 1 as solid lines), filled with a dielectric material (e.g., a silicon oxide material), may extend through the memory array region 102 proximate to and between adjacent memory cell pillars 108.

As shown in FIGS. 1 and 2, the slots 114 may be separated from each other by a first distance $D_1$ in the memory array region 102. In some embodiments, the first distance $D_1$ may be between about 400 nm and about 1000 nm. As shown in FIG. 1, in the via region 106, at least some of the slots 114 may be separated from each other by a second distance $D_2$ that is greater than the first distance $D_1$. In some embodiments, the second distance $D_2$ is at least about twice the first distance $D_1$, such as about four times the first distance $D_1$. The slots 114 may be provided for the introduction of an electrically conductive (e.g., metal) material to be coupled to (e.g., into contact with) the memory cell pillars 108 throughout the memory array region 102 to form conductive access lines 116, as will be explained below. The conductive access lines 116 are conductive word lines 116 in the embodiments shown herein, although the present disclosure is not so limited. As shown by dashed lines in FIGS. 1 and 2, the conductive word lines 116 may extend along the slots 114 and be coupled to the memory cell pillars 108. In some embodiments, the conductive word lines 116 may include a metal, such as titanium, tantalum, tantalum nitride, tungsten, or tungsten nitride. The conductive word lines 116 and memory cell pillars 108 may form an array of so-called "MONOS" (metal-oxide-nitride-oxide-semiconductor) memory cells. In some embodiments, the memory cells may be so-called "TANOS" (tantalum nitride-aluminum oxide-nitride-oxide-semiconductor) or "BETANOS" (band/barrier engineered TANOS) memory cells, which are subsets of the general category of MONOS memory cells.

Where the slots 114 are sufficiently distant from each other, such as the slots 114 in the via region 106 separated by the second distance $D_2$, the conductive word lines 116 may have a width from the slots 114 of at least a third distance $D_3$. On the other hand, where the slots 114 are sufficiently close to one another, such as the slots 114 in the memory array region 102 separated by the first distance $D_1$ that is about twice the third distance $D_3$ or less, the conductive material may form a conductive word line 116 having a width greater than the third distance $D_3$ (e.g., a width of the first distance $D_1$).

In the via region 106, adjacent conductive word lines 116 may be separated by dielectric stacks 118 of at least two different alternating dielectric materials (e.g., alternating oxide and nitride materials). Conductive vias 120 may extend through the vertical memory block 100 within the dielectric stacks 118. Since the conductive vias 120 extend through the vertical memory block 100, the conductive vias 120 are also referred to as "through-array vias" or "TAVs." Thus, the slots 114 being separated by the second distance $D_2$ in the via region 106 provides space for the conductive vias 120 to be positioned through the vertical memory block 100, without having to use space beyond the footprint of the vertical memory block 100.

Referring again to FIG. 1, the stair step region 104 may include one or more stair step structures 122 for electrically contacting and accessing different overlapping conductive word lines 116. The stair step structures 122 may include contact regions 124 (e.g., "stairs") (for clarity, labeled at the top portion of FIG. 1, but also present in the bottom portion of FIG. 1) arranged like a staircase. Word line contacts 126 (for clarity, shown and labeled at the bottom portion of FIG. 1, but also present in the top portion of the vertical memory block shown in FIG. 1) may physically and electrically contact the contact regions 124 of the stair step structures 122 to provide electrical access to the conductive word lines 116.

In some embodiments, electrical connections 128 may connect the word line contacts 126 to respective conductive vias 120, as shown near the bottom of FIG. 1. In some embodiments, the electrical connections 128 may connect the conductive vias 120 to other portions of one or more of the conductive word lines 116, as shown near the top of FIG. 1. In some embodiments, the conductive vias 120 may be electrically connected to other features or elements within the vertical memory block 100 or external to the vertical memory block 100.

Although FIG. 1 illustrates adjacent stair step structures 122 that are separated by dielectric stacks 118 of at least two different alternating dielectric materials in the via region 106, the present disclosure is not so limited. For example, rather than splitting a single conductive word line 116 into two adjacent stair step structures 122, two or more adjacent conductive word lines 116 may be merged into a single stair step structure 122. Thus, the present disclosure includes various embodiments of vertical memory blocks with split and merged word lines 116 in different regions of the vertical memory blocks, depending upon the arrangement and proximity of the slots 114.

Referring to FIG. 2, dielectric support pillars 130 (shown as dashed squares) may, optionally, be located to support dielectric materials (e.g., oxide materials) in the vertical memory block 100 during fabrication. The memory cell pillars 108 may support the dielectric materials in the memory array region 102 during fabrication. However, in portions of the vertical memory block 100 that may lack memory cell pillars 108, such as in the via region 106 or in the stair step region 104, the dielectric support pillars 130 may be used to support the dielectric materials during fabrication of the vertical memory block 100. The dielectric support pillars 130 may include a dielectric material, such as an oxide material (e.g., silicon dioxide).

FIG. 3 illustrates a partial cross-sectional view of the vertical memory block 100, taken from section line I-I of FIG. 2. In the memory array region 102, the memory cell pillars 108 (each including the central region 110 of a semiconductor material at least partially surrounded by the charge trapping material 112) and the slots 114 may vertically extend through a stack of alternating conductive word lines 116 and first dielectric materials 132. An individual memory cell (e.g., a MONOS memory cell) may be formed at each junction between the respective conductive word lines 116 and memory cell pillars 108. FIG. 3 illustrates five overlying conductive word lines 116 and five overlying first dielectric materials 132 between the conductive word lines 116. Thus, the vertical memory block 100 shown in FIG. 3 has five tiers. However, the present disclosure is not limited to vertical memory blocks 100 with five tiers. Rather, vertical memory blocks according to the present disclosure may have any number of tiers, such as at least 16, 32, 36, or 72 tiers, by way of non-limiting examples.

In the via region 106, conductive vias 120 (only one shown in FIG. 3) vertically extend through the dielectric stack 118. The dielectric stack 118 may include alternating first dielectric materials 132 and second dielectric materials 134. By way of example and not limitation, the first dielectric materials 132 may include an oxide (e.g., silicon dioxide) material, and the second dielectric materials 134 may include a nitride (e.g., silicon nitride) material. To form the conductive word lines 116, a portion of the second dielectric material 134 along the slots 114 may be selectively removed, while the first dielectric material 132 remains. A conductive material may then be formed to replace the second dielectric material 134 that was removed. Both the first and second dielectric materials 132, 134 may be present in the dielectric stack 118 because the slots 114 are sufficiently far away from each other in the via region 106 that the second dielectric material 134 is not removed in the dielectric stack 118. Thus, the first and second dielectric materials 132, 134 remain and form the dielectric stack 118, through which the conductive vias 120 may be formed to electrically isolate the conductive vias 120 from the conductive word lines 116. The conductive vias 120 may be electrically coupled to sub-array circuitry 136, such as a driver circuit, in or on a substrate 138. For example, at least one of the conductive vias 120 may operatively couple the sub-array circuitry 136 to the vertical memory block 100.

Vertical memory blocks 100 having the features and configurations described in the present disclosure may enable dense wiring with no exit channel for wires from a group of sub-blocks.

Although the present disclosure describes, by way of example, vertical memory blocks including arrays of MONOS memory cells, the present disclosure is not so limited. For example, the present disclosure may be applicable to any vertical memory block or device that is fabricated by forming memory cell materials prior to forming associated conductive materials (e.g., word lines, gate materials) coupled to the memory cell materials, such as through slots formed according to this disclosure. For example, the present disclosure also applies to so-called "floating gate" memory cells including a metal control gate as a charge trapping material 112.

Accordingly, vertical memory blocks are disclosed including a memory cell region and at least one via region. The memory cell region includes an array of memory cell pillars extending vertically through the vertical memory block. The at least one via region includes a dielectric stack of alternating dielectric materials and at least one conductive via extending through the dielectric stack.

Additionally, semiconductor devices including a vertical memory block are disclosed. The semiconductor devices include at least one driver circuit on or in a substrate and at least one vertical memory block having a longitudinal length and a lateral width on the substrate and operatively coupled to the at least one driver circuit. The at least one vertical memory block includes a three-dimensional array of memory cells, slots extending vertically through the at least one memory block laterally between adjacent memory cells of the three-dimensional array, and conductive access lines extending along and adjacent to the slots. The slots are separated by a first lateral distance in a first portion of the vertical memory block along the three-dimensional array of memory cells, and by a second, greater lateral distance in a second portion of the at least one vertical memory block adjacent to the three-dimensional array of memory cells.

Referring again to FIGS. 1 and 2, rectangular (when viewed from the top as in FIGS. 1 and 2) dielectric stacks 118 may be formed by routing the slots 114 from the first distance $D_1$ apart from each other to the second distance $D_2$ apart from each other in a step-wise fashion (i.e., by forming the slots 114 with 90 degree angles). However, the present disclosure is not so limited.

Figure 4:
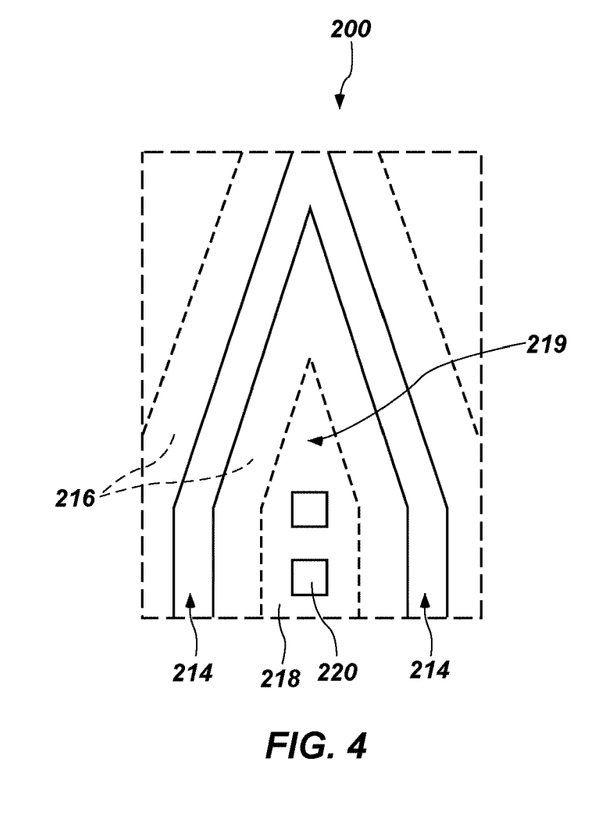
FIG. 4 shows a top view of a portion of a vertical memory block with diverging slots and a via region having a variable width according to an embodiment of the present disclosure.

As shown in FIG. 4, in some embodiments, a vertical memory block 200 may include slots 214 that gradually diverge from each other at an acute angle. Such diverging slots 214 may result in conductive word lines 216 and dielectric stacks 218 that are not rectangular. Rather, the dielectric stacks 218 between adjacent conductive word lines 216 (or adjacent portions of a single conductive word line 216) may have a shape that includes a narrow end region 219 corresponding to the adjacent diverging slots 214.

Figure 5:
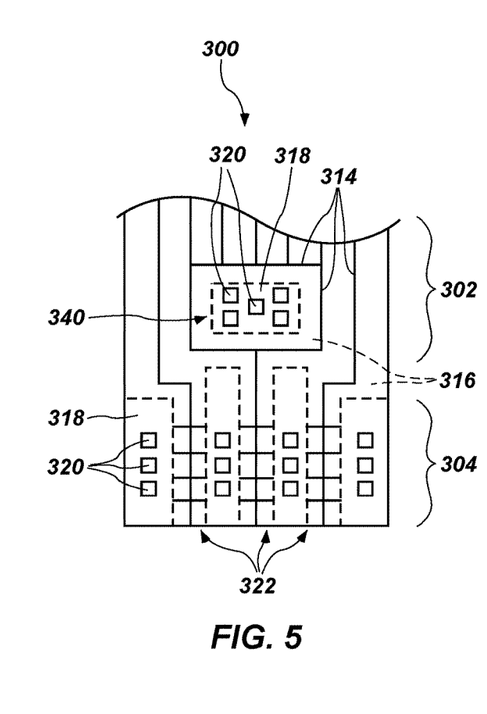
FIG. 5 shows a partial top view of a vertical memory block having a via region in a memory array region of the vertical memory block according to an embodiment of the present disclosure.

Referring to FIG. 5, in some embodiments, a vertical memory block 300 may include a dielectric stack 318 through which conductive vias 320 extend that is positioned in a memory array region 302 of the vertical memory block 300 rather than in a separate via region. For example, an area 340 of the memory array region 302 may be left free of slots 314, such that the dielectric stack 318 is between conductive word lines 316 along the slots 314 within the memory array region 302.

Additionally or alternatively, one or more dielectric stacks 318 and associated conductive vias 320 may be positioned in a stair step region 304 of the vertical memory array 300, such as adjacent to stair step structures 322.

Accordingly, the dielectric stack 318 and associated conductive vias 320 may be located at any desired location (depending on, e.g., a location of sub-array circuitry to which the conductive vias 320 are to be connected) in the vertical memory block 300. To locate the dielectric stack 318 and associated conductive vias 320 in a desired location, a sufficiently large space between adjacent slots 314 is provided at the desired location, such that adjacent conductive word lines 316 (or adjacent portions of a single conductive word line 316) do not extend all the way across the space.

Figure 6:
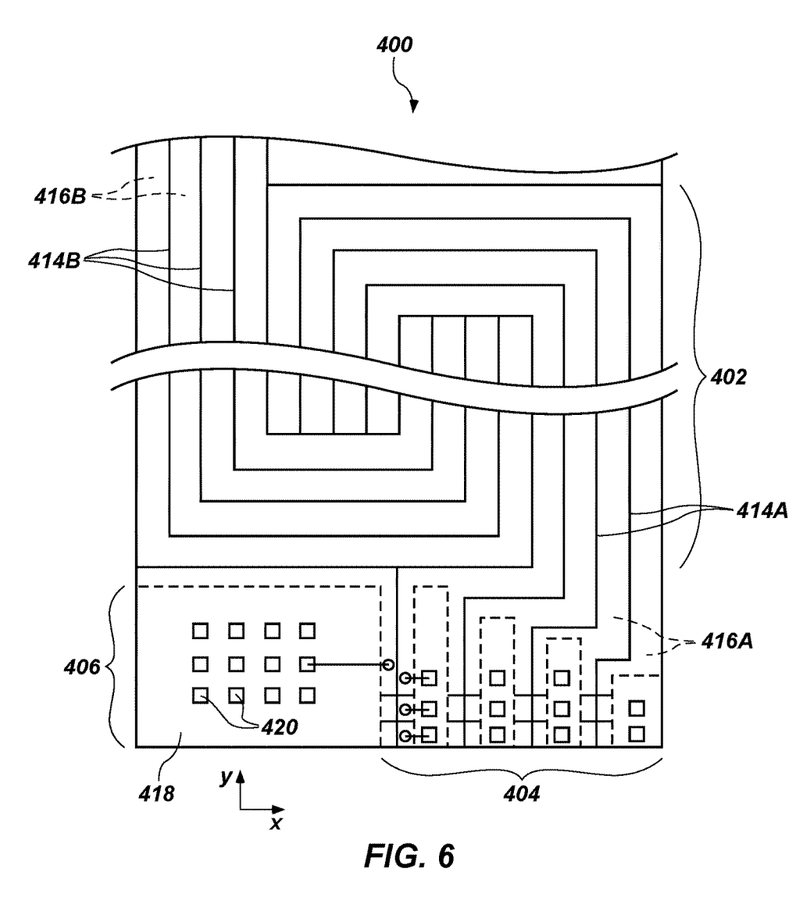
FIG. 6 shows a partial top view of a vertical memory block including an enlarged via region according to an embodiment of the present disclosure.

Referring to FIG. 6, a vertical memory block 400 may include a relatively large (compared to the embodiments described above) dielectric stack 418 in a via region 406 adjacent to a stair step region 404. A relatively wider (compared to the embodiments described above) memory array region 402 in the lateral direction x may be formed to provide additional lateral space for the dielectric stack 418 and associated conductive vias 420 in the via region 406. The additional lateral space for the dielectric stack 418 may be utilized by spacing the conductive vias 420 farther apart, by forming additional conductive vias 420 therein, or both.

The width of the memory array region 402 may be increased without reducing a density of memory cells by routing slots 414A, 414B to fill the extra width. By way of example and not limitation, the slots 414A, 414B may be routed in an interlocking-J pattern. Thus, first slots 414A for forming first conductive word lines 416A associated with a first stair step region 404 (e.g., at the bottom of the memory array block 400 depicted in FIG. 6) may extend away from the first stair step region 404 in a longitudinal direction y, laterally across a portion of the memory array block 400, and longitudinally back towards the first stair step region 404. Complementary, second slots 414B for forming conductive word lines 416B associated with another stair step region 404 (not shown in FIG. 6, but in a direction toward the top of the memory array block 400 depicted in FIG. 6) may extend away from the associated stair step region 404 in a longitudinal direction y, laterally across a portion of the memory array block 400, and longitudinally back towards the second stair step region 404. Thus, the width of the memory array region 402 and, consequently, of the vertical memory block 400, may be enlarged while substantially filling the memory array region 402 with slots 414A, 414B and corresponding conductive word lines 416A, 416B, to maintain a density of memory cells coupled to the word lines 416A, 416B within the memory array region 402.

Embodiments including slots 414A, 414B arranged in an interlocking-J pattern may enable each word line contact to connect to two or more conductive word lines 416A, 416B, such that the stair step region 404 may exhibit up to about four times the pitch between the slots 414A, 414B. The extra space may be used for a large array region 406 (as shown in FIG. 6) or for multiple dielectric stacks 418 positioned throughout the stair step region 404.

Figure 7:
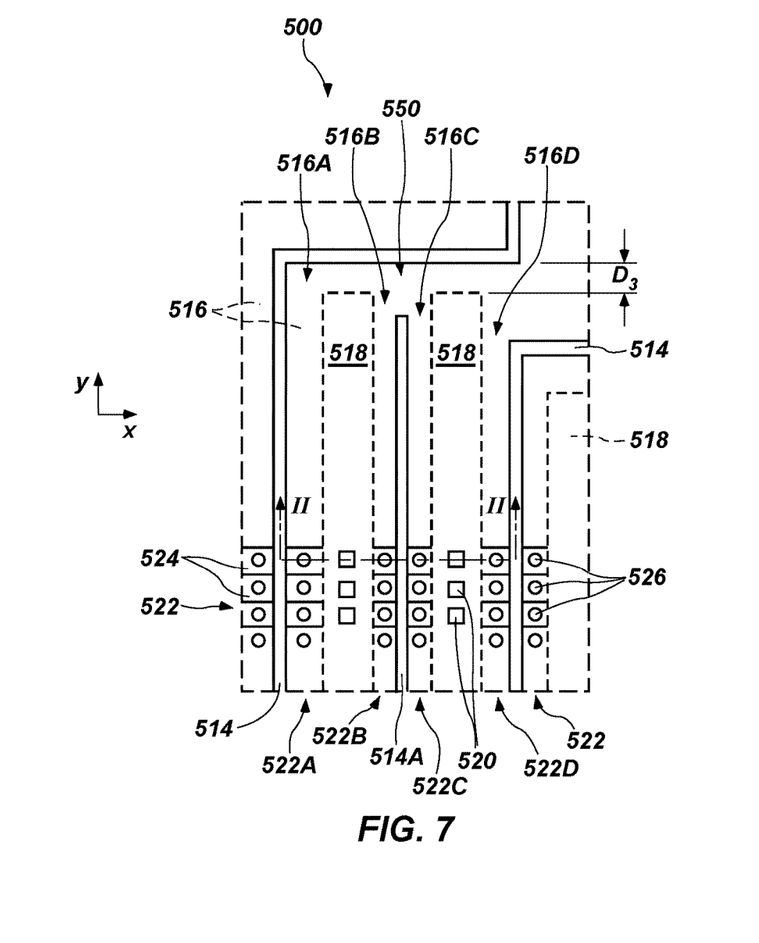
FIG. 7 shows a top view of a stair step region of a vertical memory block according to an embodiment of the present disclosure.
Figure 8:
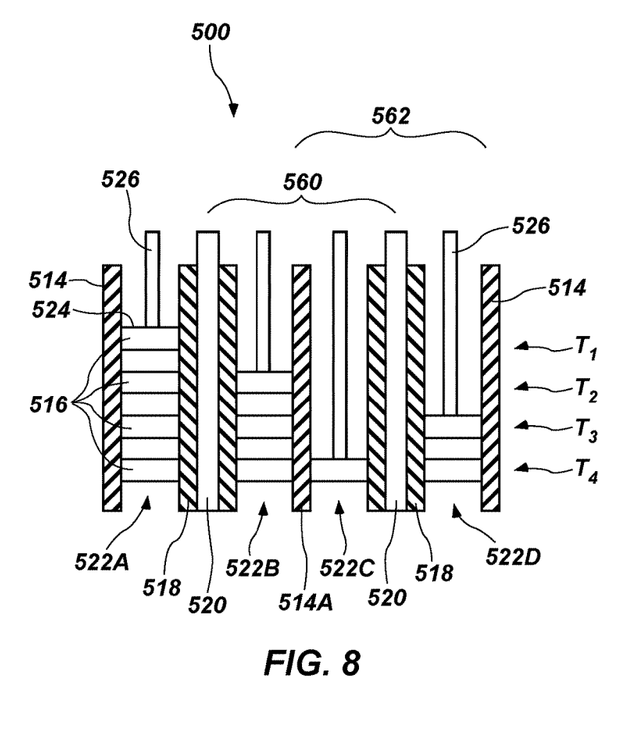
FIG. 8 shows a partial cross-sectional view of the stair step region of the vertical memory array block of FIG. 7, taken from section line II-II of FIG. 7.

FIG. 7 shows a top view of a stair step region of a vertical memory block 500 according to an embodiment of the present disclosure. FIG. 8 shows a partial cross-sectional view of the stair step portion of the vertical memory block 500 of FIG. 7, taken from section line II-II of FIG. 7. The vertical memory block 500 of FIGS. 7 and 8 includes many features and elements that are similar to the vertical memory block 100 described above with reference to FIGS. 1 through 3. For example, the vertical memory block 500 of FIGS. 7 and 8 includes slots 514, conductive word lines 516, dielectric stacks 518 of alternating dielectric materials, conductive vias 520 extending through the vertical memory block 500 within the dielectric stacks 518, and stair step structures 522 including contact regions 524 for electrically contacting and accessing different overlapping conductive word lines 516 using word line contacts 526. The conductive word lines 516 extend along the slots 514. As discussed above, the conductive word lines 516 may have a width from the corresponding slots 514 that is the third distance $D_3$ in locations where the slots 514 are sufficiently far apart from each other (e.g., more than twice the third distance $D_3$). In locations where the slots 514 are apart from each other about twice the third distance $D_3$ or less, the conductive word lines 516 may have a greater width than the third distance $D_3$, as the material of the conductive word lines 516 formed from adjacent slots 514 contact or are integrally formed with each other.

However, compared to the vertical memory block 100 of FIGS. 1 through 3, the vertical memory block 500 of FIGS. 7 and 8 includes an additional slot 514A in the stair step region that splits one area of the conductive word lines 516 into four distinct word line portions 516A, 516B, 516C, and 516D that terminate in respective stair step structures 522A, 522B, 522C, and 522D. The additional slot 514A may extend from the stair step structures 522A, 522B, 522C, and 522D in a longitudinal direction y to proximate (e.g., within about twice the third distance $D_3$ or less), but not connecting with, another one of the slots 514. A word line connection region 550 may remain between the additional slot 514A and the proximate slot 514. As shown in FIG. 8, multiple conductive word lines 516 may be vertically positioned over each other in tiers $T_1$, $T_2$, $T_3$, and $T_4$. Referring to a single conductive word line 516 (i.e., a conductive word line 516 at a particular tier $T_1$, $T_2$, $T_3$, or $T_4$), the four word line portions 516A, 516B, 516C, and 516D are physically and electrically connected to each other at the word line connection region 550. Thus, due to the presence of the additional slot 514A and the word line connection region 550 (FIG. 7), the four word line portions 516A, 516B, 516C, and 516D at any one of the tiers $T_1$, $T_2$, $T_3$, or $T_4$ are physically and electrically connected fingers of the same conductive word line 516.

As is known by those of ordinary skill in the art, stair step structures for electrical connection to conductive word lines (or word line plates) at the tiers of vertical memory blocks may be formed by utilizing a so-called "stair step mask" and, optionally, one or more so-called "chop masks." A stair step mask may be formed over the vertical memory block while leaving one step-width (e.g., a width of one contact region 524 measured in the longitudinal direction y) exposed. One or more tiers of conductive material (e.g., of the conductive word lines 516) exposed through the stair step mask may be removed, such as by a first cycle of anisotropic material removal (e.g., etching). An edge of the stair step mask may be removed to recess the edge of the stair step mask and to expose another step-width, in addition to the original exposed step-width. Another cycle of material removal may be performed to remove another one or more tiers of conductive material exposed through the recessed stair step mask. The process may be repeated to form a desired number of contact regions (e.g., contact regions 524, also referred to as "stairs").

A chop mask may be used cover one or more particular stair step structures or portions thereof (e.g., one or more of the stair step structures 522, 522A, 522B, 522C, 522D), while leaving one or more other stair step structures or portions thereof exposed through the chop mask. The entire exposed one or more other stair step structures or portions thereof is vertically recessed, such that one or more exposed tiers is removed. Thus, the one or more stair step structures exposed through the chop mask may be vertically recessed from the one or more stair step structures that is covered by the chop mask, such that the one or more exposed stair step structures defines contact regions ("stairs") for tiers that are lower than the tiers having contact regions ("stairs") for the one or more stair step structures covered by the chop mask. A chop mask may be used before or after the stair step mask is used. Chop masks are used to provide contact to additional tiers of the vertical memory block while reducing the size of an area that the stair step structures cover. In addition, process control of removing material utilizing a stair step mask to form a stair step structure, as described above, may be difficult to maintain for a large number of cycles (e.g., more than about 12 cycles) and tiers. A single chop mask may be used to double the number of contact regions ("stairs") of a stair step structure formed using a single stair step mask. By way of a non-limiting example, a stair step mask may be used to form a stair step structure of 12 contact regions, for accessing 12 respective tiers. A chop mask may be used to expose and access 12 additional tiers underlying the 12 tiers formed by the stair step mask alone.

Returning to methods and structures of the present disclosure, as shown in FIG. 8, after (or, alternatively, before) a stair step mask is used to form an initial stair step structure, a first chop mask may be positioned to cover the first and fourth stair step structures 522A, 522D, while leaving the second and third stair step structures 522B, 522C exposed, as indicated under a first bracket 560 in FIG. 8. One material removal cycle may be performed to remove exposed portions of the topmost conductive word line 516 in a first tier $T_1$. The first chop mask may be removed, and a second chop mask may be positioned to cover the first and second stair step structures 522A, 522B, while leaving the third and fourth stair step structures 522C, 522D exposed, as indicated under a second bracket 562 in FIG. 8. Two material removal cycles may be performed to remove exposed portions of the conductive word lines 516 in a second tier $T_2$ and third tier $T_3$ in the third stair step structure 522C, and to remove exposed portions of the two conductive word lines 516 in the first tier $T_1$ and a second tier $T_2$ of the fourth stair step structure 522D. In this manner, a contact region 524 for the first tier $T_1$ may be defined in the first stair step structure 522A, a contact region 524 for the second tier $T_2$ may be defined in the second stair step structure 522B, a contact region 524 for the third tier $T_3$ may be defined in the fourth stair step structure 522D, and a contact region 524 for the fourth tier $T_4$ may be defined in the third stair step structure 522C.

In the embodiment shown in FIGS. 7 and 8, four cycles of material removal may be performed in connection with each time a corresponding stair step mask is recessed, such that successively lower "stairs" in a single stair step structure 522, 522A, 522B, 522C, 522D are four tiers lower than a successively higher "stair" in the same stair step structure 522, 522A, 522B, 522C, 522D.

In some embodiments, a single material removal cycle may be performed in connection with each time a corresponding stair step mask is recessed to form "stairs." In such embodiments, assuming S number of stairs are formed using the stair step mask alone, a first chop mask may be used to remove exposed portions of the same S number of conductive word lines 516 from the second and third stair step structures 522B, 522C, and a second chop mask may be used to remove exposed portions of twice the S number of eight conductive word lines 516 from the third and fourth stair step structures 522C, 522D. The embodiment shown in FIGS. 7 and 8 is an example of such embodiments, in which the S number of stairs formed using the stair step mask alone is four.

Thus, in embodiments employing the additional slot 514A and including a word line connection region 550, as shown by way of example in FIGS. 7 and 8, a single stair step mask and two chop masks may be sufficient to form distinct contact regions 524 for a quantity of tiers up to four times the number of contact regions 524 exposed by the single stair step mask alone.

Figure 9A:
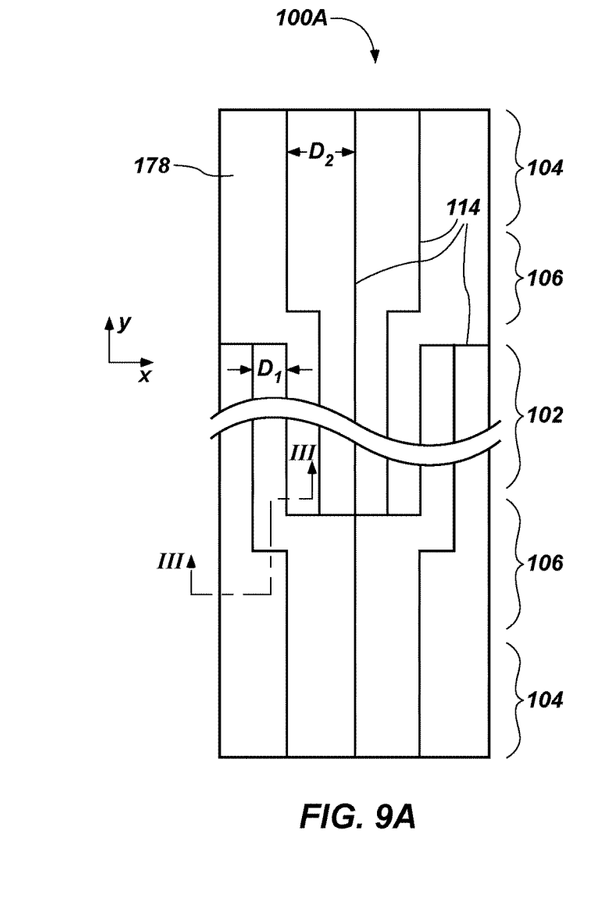

FIGS. 9A through 13 illustrate a method of forming a vertical memory block, such as the vertical memory block 100 of FIG. 1. FIG. 9A shows a top view of a vertical memory block structure 100A, and FIG. 9B shows a cross-sectional view of the vertical memory block structure 100A taken from section line of FIG. 9A. Referring to FIG. 9B, a stack 178 of alternating first and second dielectric materials 132, 134 is formed over the substrate 138, which may include the sub-array circuitry 136. The first dielectric material 132 may be, for example, an oxide material such as silicon dioxide. The second dielectric material 134 may be, for example, a nitride material such as silicon nitride. The memory cell pillars 108 may be formed in the memory array region 102 (FIG. 9A), each of which may include the central region 110 of a semiconductor material at least partially surrounded by a charge trapping material 112. By way of example, the memory cell pillars 108 may be formed by anisotropically removing portions of the first dielectric material 132 and second dielectric material 134 to form holes through the stack 178, after which an oxide, nitride, and oxide material is formed along sidewalls defining the holes through the stack 178 to form the charge trapping material 112. A semiconductor material may be formed to fill the remaining holes to form the central region 110 of the memory cell pillars 108. Optionally, dielectric support pillars 130 (FIG. 2) of a dielectric material (e.g., an oxide material, such as silicon dioxide) may additionally be formed in locations lacking memory cell pillars 108, to provide support for the first dielectric materials 132 in those locations during subsequent operations.

Figure 9B:
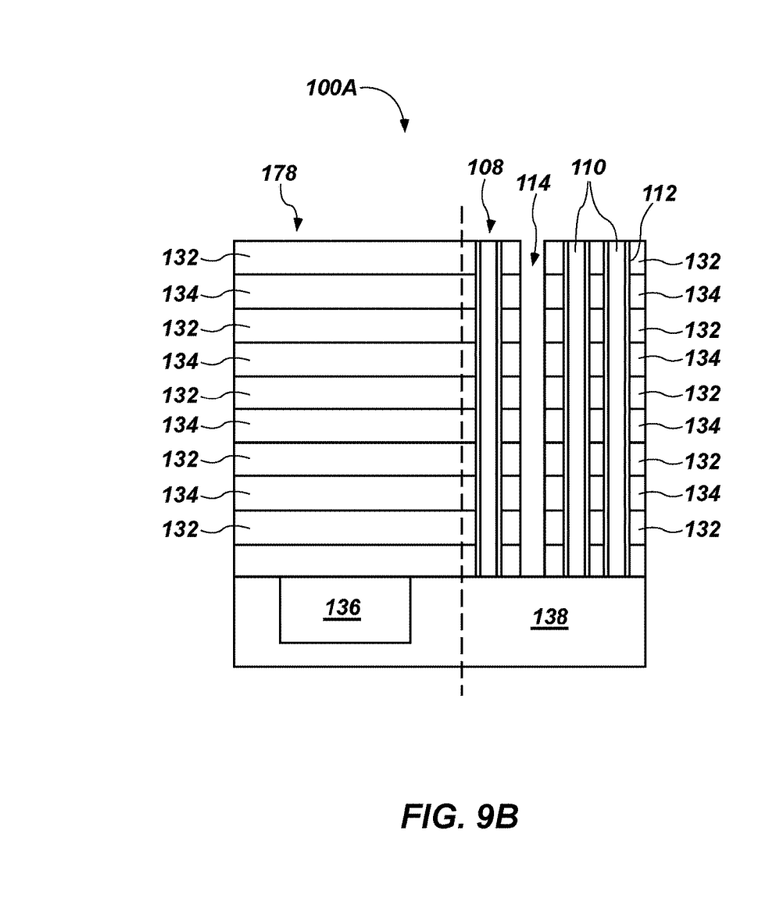

Referring to FIGS. 9A and 9B, the slots 114 may be formed by anisotropically removing portions of the first dielectric material 132 and second dielectric material 134. The slots 114 may be formed to be separated from adjacent slots 114 by a first distance $D_1$ in the memory array region 102 of the stack 178, and at least some of the slots 114 in the stair step region 104 and the via region 106 may be separated by a second distance $D_2$ greater than the first distance $D_1$.

Figure 10A:
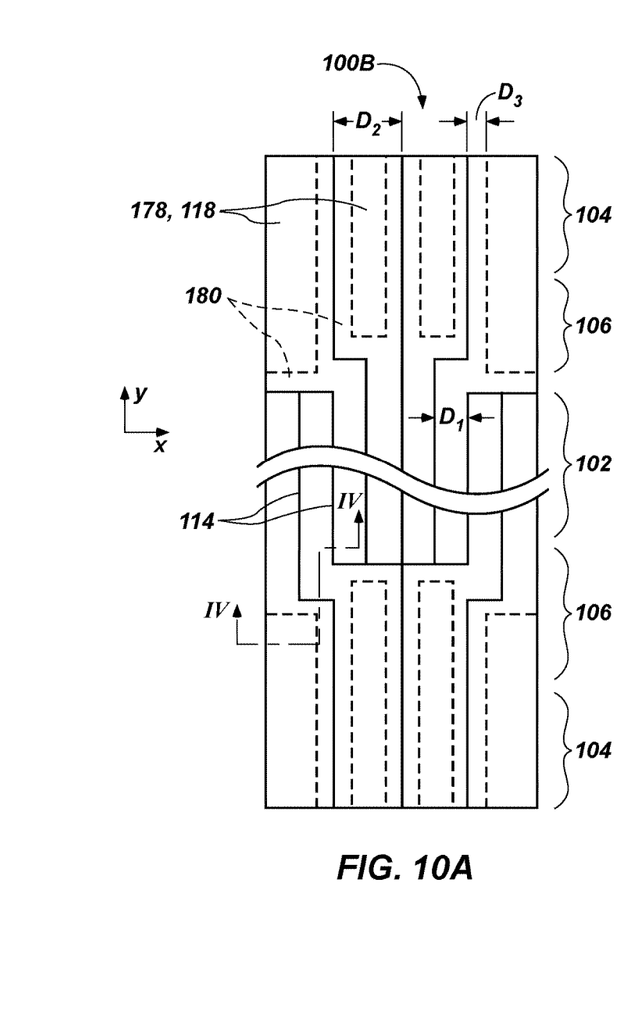
Figure 10B:
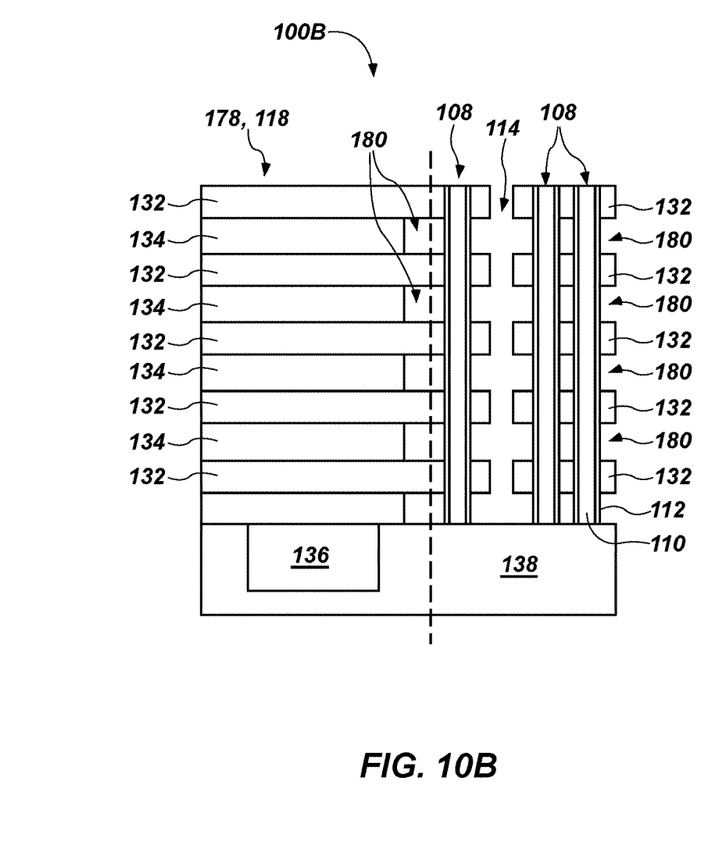

FIG. 10A shows a top view of a vertical memory block structure 100B formed from the vertical memory block structure 100A of FIGS. 9A and 9B after additional processing. FIG. 10B shows a cross-sectional view of the vertical memory block structure 100B taken from section line IV-IV of FIG. 10A.

Referring to FIGS. 10A and 10B, portions of the second dielectric material 134 of the stack 178 adjacent to the slots 114 may be removed through the slots 114, such as by an isotropic material removal process that selectively removes the second dielectric material 134 relative to the first dielectric material 132 and the charge trapping material 112 of the memory cell pillars 108. One of ordinary skill in the art is familiar with such isotropic removal processes. The material removal process may form access line gaps 180 (referred to below as "word line gaps 180") between the first dielectric materials 132. Based on the amount of time and chemistry used to remove the portions of the second dielectric material 134 and to form the word line gaps 180, the word line gaps 180 may have a width from the slots 114 of the third distance $D_3$. The third distance $D_3$ may be about half the first distance $D_1$ between the slots 114 in the array region 102 or more, such that the word line gaps 180 extend from one slot 114 to an adjacent slot 114 in locations where the slots 114 are separated by the first distance $D_1$, such as in the memory array region 102. The second distance $D_2$ may be about twice the first distance $D_1$ or more, such that portions of the stack 178 of alternating dielectric materials remains between adjacent slots 114 in locations where the slots 114 are separated by the second distance $D_2$, such as in the stair step region 104 and the via region 106, to define the dielectric stacks 118 in those locations.

Figure 11:
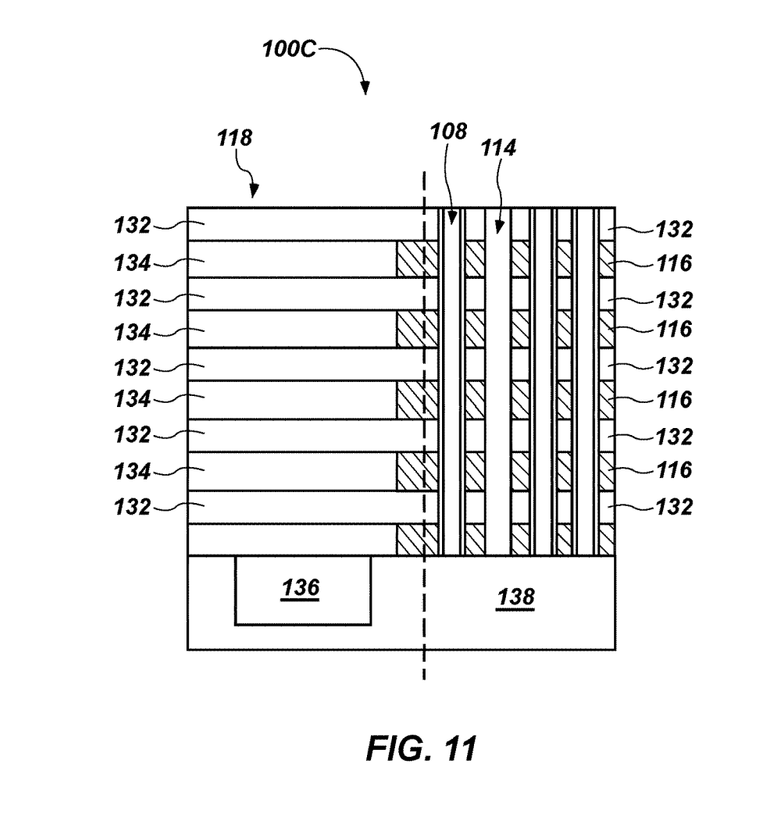

FIG. 11 shows a cross-sectional view of a vertical memory block structure 100C formed from the vertical memory block structure 100B of FIGS. 10A and 10B after additional processing. Referring to FIG. 11, the word line gaps 180 (FIG. 10B) may be filled with a conductive material (e.g., titanium, tantalum, tantalum nitride, tungsten, or tungsten nitride) to form the conductive word lines 116. Any residual conductive material within the slots 114 may be removed, and the slots 114 may be filled with a dielectric material (e.g., an oxide material, a nitride material).

Figure 12:
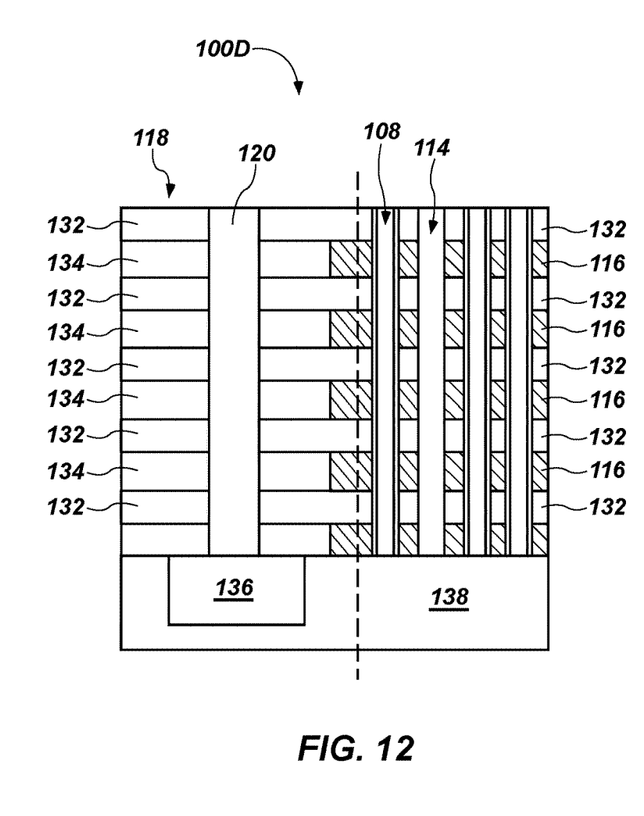

FIG. 12 shows a cross-sectional view of a vertical memory block structure 100D formed from the vertical memory block structure 100C of FIG. 11 after additional processing. Referring to FIG. 12, conductive vias 120 may be formed to extend through the dielectric stacks 118 of the alternating first and second dielectric materials 132, 134 to electrically contact the sub-array circuitry 136 in or on the substrate 138. To form the conductive vias 120, portions of the first and second dielectric materials 132, 134 in the dielectric stacks 118 may be anisotropically removed to form through holes, which may be at least partially filed with a conductive via material (e.g., titanium, tantalum, tantalum nitride, tungsten, or tungsten nitride).

Figure 13:
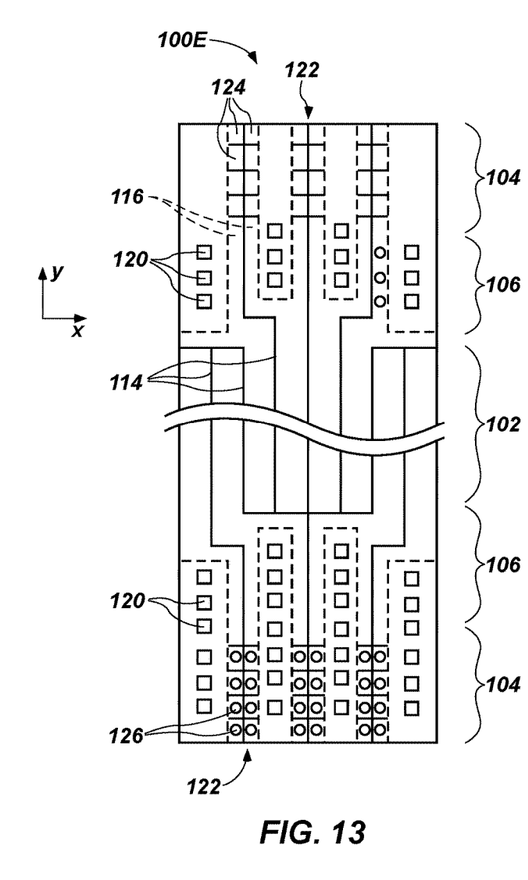

FIG. 13 is a top view of a vertical memory block structure 100E formed from the vertical memory block structure 100D of FIG. 12 after additional processing. As shown in FIG. 13, ends of the conductive word lines 116 proximate longitudinal ends of the vertical memory block structure 100E may be processed to form the stair step structures 122, defining the contact regions 124 for electrically contacting and accessing the conductive word lines 116 of different tiers. As generally described above with reference to FIGS. 7 and 8, the stair step structures 122 may be formed using a stair step mask and, optionally, one or more chop masks, as is known to one of ordinary skill in the art. After the stair step structures 122 are formed to define the contact regions 124, the word line contacts 126 may be formed to physically and electrically contact the respective conductive word lines 116. Electrical connections 128 (FIG. 1) may be formed between the conductive vias 120 and other conductive elements, such as the word line contacts, for example.

Although the formation of the conductive vias 120 has been explained and illustrated as occurring subsequent to the formation of the conductive word lines 116 and the filling of the slots 114 with a dielectric material, the present disclosure is not so limited. For example, the conductive vias 120 may be formed prior to, during, or after the formation of the conductive word lines 116 and the filling of the slots 114 with a dielectric material. In some embodiments, the conductive vias 120 may be formed after forming the stair step structures 122, such as during a same process in which the word line contacts 126 are formed.

The methods described herein enable the formation of through-array vias 120 without the need for removing conductive material 116 and other portions of the vertical memory block 100 in a separate material removal act to form the conductive vias 120. Rather, the methods of the present disclosure utilize dielectric materials (e.g., the first and second dielectric materials 132, 134) that are already present during the formation of the vertical memory block 100 as a location for forming the conductive vias 120. Such methods provide efficient use of the materials and processes used to form the vertical memory block 100.

Accordingly, the present disclosure includes methods of forming a vertical memory block of a semiconductor device. In accordance with such methods, a stack of alternating first dielectric materials and second dielectric materials is formed. Portions of the first dielectric materials and second dielectric materials are removed to form slots extending through the stack. The slots are separated by a first distance in a memory array region of the vertical memory block and by a second, greater distance in a via region of the vertical memory array block. Portions of the second dielectric materials adjacent to the slots are removed to form access line gaps extending along the slots. Portions of the second dielectric material are left in the via region. A conductive material is formed within the access line gaps to form conductive access lines. At least one conductive via is formed to extend through the first dielectric materials and the second dielectric materials in the via region.

Figure 14:
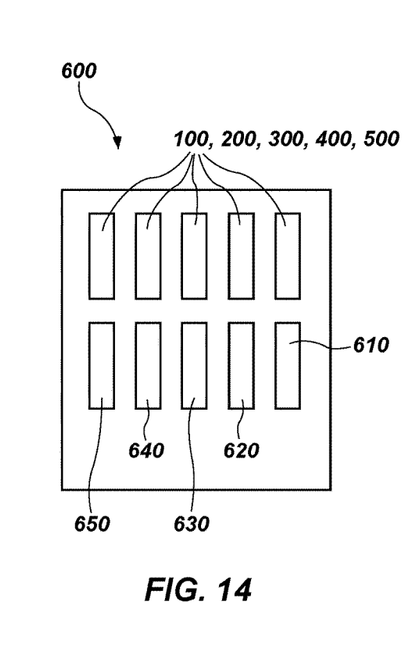
FIG. 14 shows a memory device including at least one vertical memory block according to an embodiment of the present disclosure.

The present disclosure also includes devices and systems that include one or more of the vertical memory blocks 100, 200, 300, 400, 500 described above. As shown in FIG. 14, a semiconductor memory device 600 may include one or more of the vertical memory blocks 100, 200, 300, 400, 500 described above. The semiconductor memory device 600 may also include additional elements, such as communication circuitry 610, drivers 620, a memory controller 630, an amplifier 640, and a decoder 650, for example. In some embodiments, one or more of the additional elements may be formed under the vertical memory blocks 100, 200, 300, 400, 500 and electrically contacted using through-array vias (e.g., the conductive vias 120, 220, 320, 420, 520 described above). A semiconductor system may include a semiconductor memory device 600 as described herein.

The embodiments of the disclosure described above and illustrated in the accompanying drawing figures do not limit the scope of the invention, since these embodiments are merely examples of embodiments of the disclosure. The invention is encompassed by the appended claims and their legal equivalents. Any equivalent embodiments lie within the scope of this disclosure. Indeed, various modifications of the present disclosure, in addition to those shown and described herein, such as other combinations and modifications of the elements described, will become apparent to those of ordinary skill in the art from the description. Such embodiments, combinations, and modifications also fall within the scope of the appended claims and their legal equivalents.

What is claimed is:

1. A memory block of a semiconductor device, the memory block comprising:
    a memory cell region including an array of memory cell pillars;
    at least one stair step region;
    at least one via region at least partially located between the memory cell region and the at least one stair step region, the at least one via region including at least one conductive via extending through a stack of alternating dielectric materials; and
    a dielectric material within slots extending through the memory block, the slots separated by a first distance in the memory cell region and by a second, greater distance in each of the at least one stair step region and the at least one via region.

2. The memory block of claim 1, wherein the array of memory cell pillars comprises an array of vertical memory cell pillars extending vertically through the memory block.

3. The memory block of claim 1, wherein the at least one stair step region comprises two stair step regions located remote from one another, each of the two stair step regions comprising at least one stair step structure defining contact regions of conductive word lines extending along and adjacent to the dielectric material within the slots.

4. The memory block of claim 3, further comprising electrical connections configured to connect the at least one conductive via to the conductive word lines.

5. The memory block of claim 3, wherein the at least one via region comprises two via regions, each of the two via regions being at least partially located longitudinally between a centrally located memory cell region and a respective stair step region, each of the two stair step regions located remote from the centrally located memory cell region.

6. The memory block of claim 3, wherein the slots filled with the dielectric material comprise at least one additional slot filled with the dielectric material in the at least one stair step region, the at least one additional slot not connected with any other slot of the slots.

7. The memory block of claim 6, wherein:
    a terminal end of the at least one additional slot is located at about the first distance or less from one of the slots;
    a connection region is located between the at least one additional slot and the one of the slots; and
    the at least one stair step structure comprises four stair step structures connected to one other through the connection region.

8. The memory block of claim 1, wherein at least a portion of the at least one via region comprises:
    first slots filled with the dielectric material defining first conductive word lines associated with a first stair step region; and
    second slots filled with the dielectric material defining second conductive word lines associated with a second stair step region, wherein the first slots and the second slots are arranged in an interlocking-J pattern.

9. The memory block of claim 1, wherein at least some of the slots filled with the dielectric material converge with adjacent slots to form a narrow end region between converging conductive word lines.

10. The memory block of claim 1, wherein the at least one conductive via is located within at least one of the memory cell region or the at least one stair step region.

11. A semiconductor device comprising:
    sub-array circuitry; and
    at least one memory block operatively coupled to the sub-array circuitry, the at least one memory block comprising:
        an array of memory cells in a memory cell region;
        at least one stair step region;
        at least one via region at least partially located between the memory cell region and the at least one stair step region;
        slots filled with a dielectric material and extending through the at least one memory block; and
        conductive access lines respectively coupled to the array of memory cells, the conductive access lines extending along and adjacent to the slots, wherein the slots are separated from each other by a first distance in the memory cell region and by a second, greater distance in each of the at least one stair step region and the at least one via region of the at least one memory block.

12. The semiconductor device of claim 11, wherein:
    the at least one memory block comprises at least one three-dimensional memory block having a longitudinal length, a lateral width, and a vertical height; and
    the array of memory cells comprises an array of vertical memory cells.

13. The semiconductor device of claim 11, wherein the conductive access lines extending along and adjacent to the slots in the memory cell region have a width from the slots that is about half of the first distance separating the slots in the memory cell region.

14. The semiconductor device of claim 11, wherein the at least one via region comprises conductive through-array vias extending through a stack.

15. The semiconductor device of claim 14, wherein the stack comprises first dielectric materials comprising an oxide material alternating with second dielectric materials comprising a nitride material.

16. The semiconductor device of claim 14, wherein the sub-array circuitry comprises a driver circuit located on or in a substrate of the semiconductor device, the driver circuit being located under and operably coupled to at least one of the conductive through-array vias.

17. A method of forming a memory block of a semiconductor device, the method comprising:
  forming an array of memory cell pillars in a memory cell region;
  forming at least one stair step region;
  forming at least one conductive via extending through a stack of alternating dielectric materials in at least one via region, the at least one via region at least partially located between the memory cell region and the at least one stair step region; and
  forming a dielectric material within slots through a memory block, the slots separated by a first distance in the memory cell region and by a second, greater distance in each of the at least one stair step region and the at least one via region.

18. The method of claim 17, wherein forming the array of memory cell pillars comprises forming an array of vertical memory cell pillars.

19. The method of claim 18, wherein forming the dielectric material within the slots through the memory block further comprises forming conductive access lines along and adjacent to the dielectric material within the slots, the conductive access lines extending between respective vertical memory cell pillars of the array of vertical memory cell pillars and contact regions in the at least one stair step region.

20. The method of claim 17, wherein forming the at least one stair step region comprises forming two stair step regions at opposing longitudinal ends of the memory block and positioning the at least one via region and the memory cell region between the two stair step regions.

* * * * *

UNITED STATES PATENT AND TRADEMARK OFFICE
CERTIFICATE OF CORRECTION

Page 1 of 1

PATENT NO. : 10,062,708 B2
APPLICATION NO. : 15/666064
DATED : August 28, 2018
INVENTOR(S) : Eric H. Freeman and Justin B. Dorhout It is certified that error appears in the above-identified patent and that said Letters Patent is hereby corrected as shown below:

In the Specification
Column 10, Line 65, change "section line of" to --section line III-III of--

Signed and Sealed this
Second Day of October, 2018

Andrei Iancu
*Director of the United States Patent and Trademark Office*